United States Patent [19]

Maruyama

[11] Patent Number: 5,309,017
[45] Date of Patent: May 3, 1994

[54] ASSEMBLY LEAD FRAME WITH COMMON LEAD ARRANGEMENT FOR SEMICONDUCTOR DEVICES

[75] Inventor: Atsushi Maruyama, Nagano, Japan

[73] Assignee: Fuji Electric Co., Ltd., Kawasaki, Japan

[21] Appl. No.: 6,657

[22] Filed: Jan. 21, 1993

[30] Foreign Application Priority Data

Jan. 30, 1992 [JP] Japan .................................. 4-14382

[51] Int. Cl.⁵ ..................... H01L 23/48; H01L 29/46; H01L 29/62; H01L 29/64
[52] U.S. Cl. .................................. 257/666; 257/676; 257/706
[58] Field of Search .............. 257/666, 676, 706, 707, 257/720, 722, 723, 724

[56] References Cited

U.S. PATENT DOCUMENTS

| 4,307,297 | 12/1981 | Groffe et al. | 257/666 |
| 4,446,375 | 5/1984 | Aird | 257/666 |
| 5,041,902 | 8/1991 | McShane | 257/706 |
| 5,126,823 | 6/1990 | Otsuka et al. | 257/666 |
| 5,200,806 | 4/1993 | Sawaya | 257/675 |

FOREIGN PATENT DOCUMENTS 59-175145  10/1984  Japan .................................. 257/676
1512920    6/1978  United Kingdom .

Primary Examiner—William Mintel
Assistant Examiner—S. V. Clark
Attorney, Agent, or Firm—Brumbaugh, Graves, Donohue & Raymond

[57] ABSTRACT

A lead frame for facilitating assembly and interconnection of a plurality of integrated circuit chips comprises a pattern of planar conductors including a surrounding outer connecting strip to which other conductors are temporarily joined, said outer connecting strip having an open end and a closed end. The other conductors comprise a plurality of chip mount conductive areas, each for mounting one of a plurality of chips, disposed in a fan-like arrangement adjacent to the closed end of said outer connecting strip and each connected to said outer connecting strip by a respective tie bar. The other conductors further comprise a plurality of common leads disposed in a semicircular pattern within the fan-like arrangement of the conductive areas, each adapted for connection to selected electrodes of said plurality of chips and a first plurality of parallel external leads drawn out from said common leads arranged in a row, all of said external leads being temporarily connected together and to said outer connecting strip by a common tie bar extending across the open end of said outer connecting strip.

4 Claims, 2 Drawing Sheets

ASSEMBLY LEAD FRAME WITH COMMON LEAD ARRANGEMENT FOR SEMICONDUCTOR DEVICES

BACKGROUND OF THE INVENTION

This invention relates generally to semiconductor devices and, more particularly, to a lead frame which makes possible a cost-efficient semiconductor device assembly process.

Methods of manufacturing semiconductor devices with semiconductor IC chips assembled on a lead frame which is then resin-sealed using a transfer molding method, have been widely adopted to take advantage of mass-production and assembly. Recently, power IC products in which power transistors, along with their control and protection circuits, are assembled on one chip have been developed and distributed widely on the market for use as power supply and control circuits in the power electronics field. Under these circumstances, a demand has been created for a product, which has more than one of these power IC products assembled on a single lead frame, which is then assembled into a resin package with the aim of reducing the size and weight of the semiconductor device.

The basic pattern of conventional lead frames has a chip mount and leads formed corresponding to a semiconductor device. For this reason, if several semiconductor chips are assembled on a lead frame with a basic pattern laid, and accommodated on one package, the number of external leads leading from the package will simply be an integer multiplication value of the number of chips, whereas, in addition to the increase in product size, a problem will arise with the dissipation of heat generated in the semiconductor chips in a construction where a chip mount is formed in the central area of the lead frame onto which semiconductor chips such as power ICs are mounted.

Among the objects of the present invention are: to solve the above problems; to provide an assembly lead frame with high flexibility that corresponds to the semiconductor devices used for diversified applications; and to provide a semiconductor device that realizes size and weight reduction of the product being assembled on the lead frame, with resin-sealed semiconductor devices incorporating various ICs in one package.

SUMMARY OF THE INVENTION

In a lead frame for facilitating assembly and interconnection of a plurality of integrated circuit chips, the number of leads and the size of the device can be minimized while heat dissipation is maximized. The lead frame comprises a pattern of planar conductors including a surrounding outer connecting strip to which other conductors are temporarily joined, said outer connecting strip having an open end and a closed end. The other conductors comprise a plurality of chip mount conductive areas, each for mounting one of a plurality of chips, disposed in a fan-like arrangement adjacent to the closed end of said outer connecting strip and each connected to said outer connecting strip by a respective tie bar. The other conductors further comprise a plurality of common leads disposed in a semicircular pattern within the fan-like arrangement of the conductive areas, each adapted for connection to selected electrodes of said plurality of chips and a first plurality of parallel external leads drawn out from said common leads arranged in a row, all of said external leads being temporarily connected together and to said outer connecting strip by a common tie bar extending across the open end of said outer connecting strip.

BRIEF DESCRIPTION OF THE DRAWINGS

Other objects, features and advantages of the invention will become apparent, and its construction and operation better understood, from the following detailed description when read in conjunction with the accompanying drawings, in which.

DETAILED DESCRIPTION OF THE PREFERRED EMBODIMENT

Figure 1:
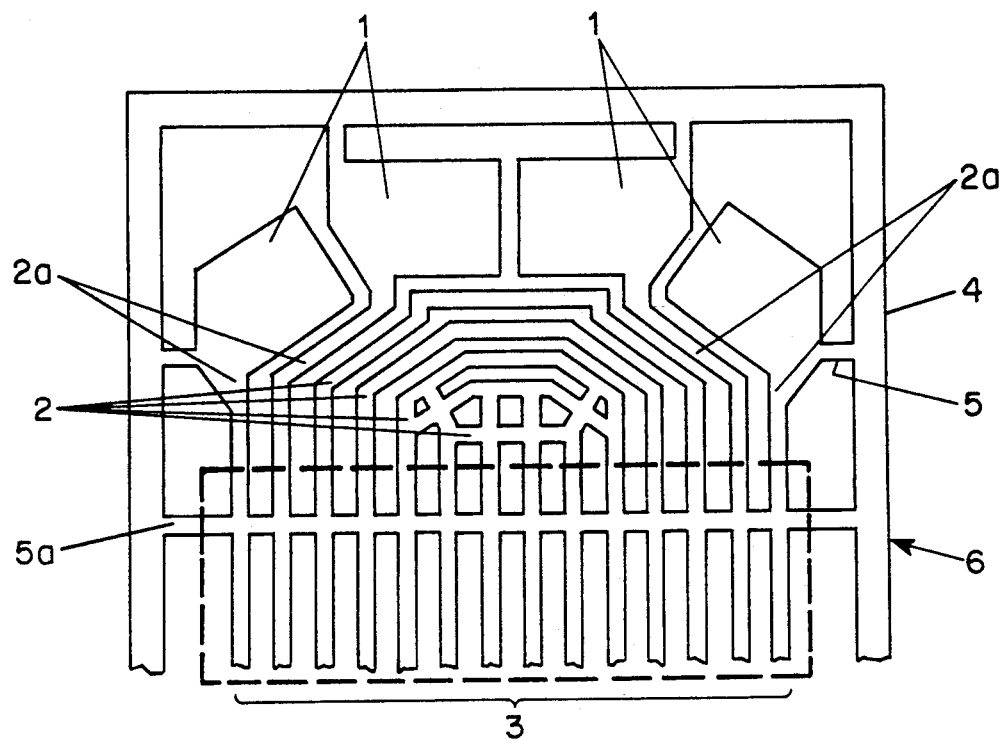
FIG. 1 is a plan view showing the basic pattern of a lead frame according to the present invention.

Referring to the drawings, the basic pattern of planar conductors for the lead frame shown in FIG. 1 includes four conductive areas 1 for mounting chips which are disposed in a fan-like pattern along a closed portion of the periphery of the frame 6. A multiplicity of common leads 2 are laid parallel to each other in a semicircular pattern, one within the other, on the inner side of the fan-like chip mount arrangement. Chip mount leads 2a are drawn out from each chip mount 1 and laid along the outside of the semicircular pattern of the common leads 2. A multiplicity of external leads 3 are arranged along the frame periphery on the side opposite to the chip mounts 1, each aligned with a respective common lead 2 or chip mount lead 2a, the external leads 3 forming a row of external leads 3. An outer connecting strip 4 having an open end and a closed end surrounds the outer circumference of the frame. Each chip mount 1 is temporarily joined to the connecting strip 4 by a respective tie bar 5, and a single tie bar 5a formed across the external leads 3 of the frame joins the external leads 3 together and to the surrounding connecting outer strip 4.

Repeating, FIG. 1 depicts an embodiment wherein the external leads 3 which are drawn out from the chip mount leads 2a are disposed at opposite ends of the row of external leads 3, and the external leads 3 which are drawn out from the common leads 2 are arranged between those drawn out from the chip mount leads 2a. The beneficial heat-out dissipating effects of this construction are discussed herein.

Figure 2:
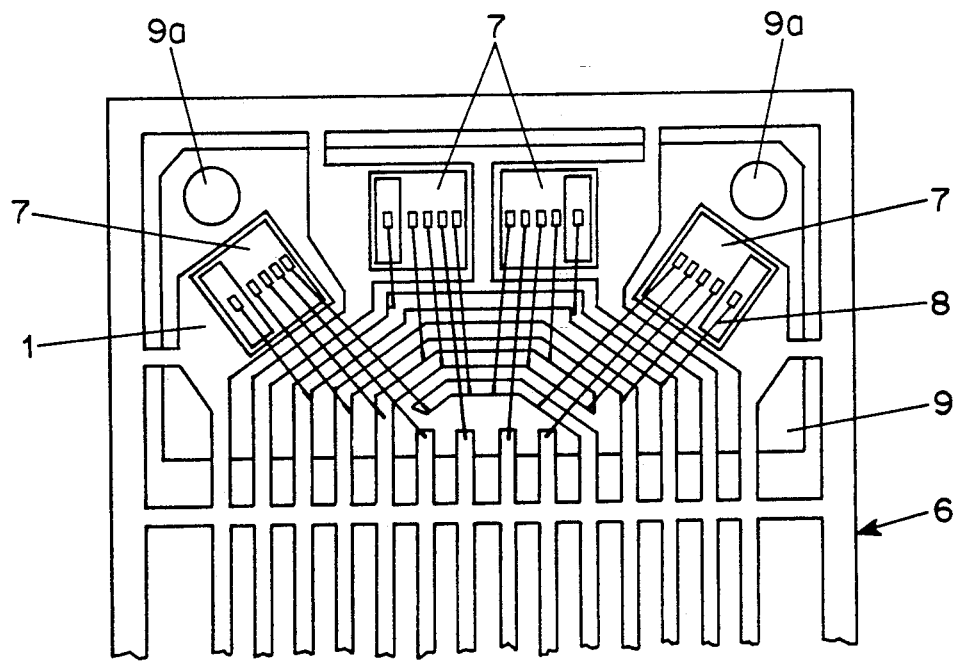
FIG. 2 is a plan view of a first embodiment of an assembled semiconductor device incorporating the lead frame shown in FIG. 1.
Figure 3:
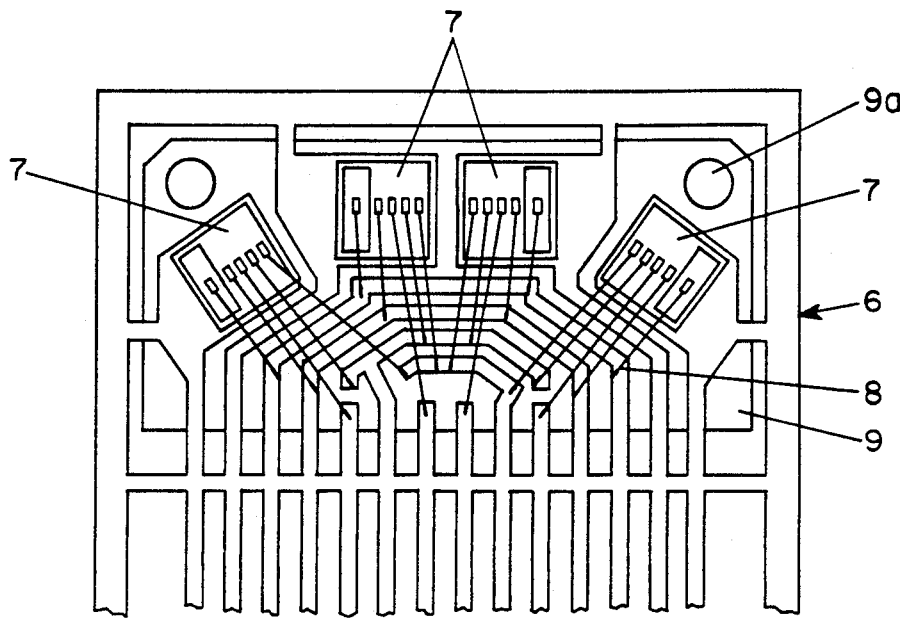
FIG. 3 is a plan view of an alternative embodiment of an assembled semiconductor device.

FIGS. 2 and 3 show two embodiments of semiconductor devices which may be assembled using a lead frame 6 of the above-mentioned construction. The figures illustrate semiconductor device before the connecting strip 4 and the tie bars 5 and 5a are cut off. Semiconductor chips 7, such as power ICs, are mounted on the chip mounts 1. Bonding wires 8 connect the semiconductor chips 7 to the common leads 2 on the lead frame 6. A resin package 9 with fixing screw holes 9a is formed around the lead frame 6 as part of the assembly process of the present invention described more fully below. The unnecessary portions across the common leads 2 and the external leads 3 near the center of the lead frame 6 are cut off. A heat-dissipating metallic plate 10 is molded on the bottom of the resin package 9 close to the rear side of the lead frame 6.

The assembly procedure for the semiconductor device of the present invention is now more fully explained. First, on the basic pattern on the lead frame 6 shown in FIG. 1, the unnecessary portions of the common leads 2 are cut off where the common leads 2 join with the external leads 3 near the center of the conductor pattern. A comparison between FIGS. 1 and 2 and a further comparison with FIG. 3 serves to illustrate several of the numerous configurations which are possible. The portions of the common leads 2 to be cut away are determined according to the internal wiring of the desired semiconductor device, and lead cutting is done by using a lead-processing machine.

Next, the semiconductor chips 7 are mounted on the chip mounts 1, and thereafter, the groups of the electrodes with common potential on the semiconductor chips 7 are wire-bonded to the common leads 2 as shown in FIG. 2 or 3. In the embodiments shown, the external leads 3 which are laid at opposite ends of the row of external leads 3 may be used for the main terminal in which the main current flows, and the external leads 3 which are laid between those drawn out from the chip mount leads 2a may be used for the control terminal so that the heat generated due to the flow of the main current may be dissipated more easily.

Next, the lead frame 6 on which the semiconductor chips 7 are assembled and a heat-dissipating metallic plate 10 are inserted into a transfer die and held in that die, which is filled with forming resin to form the resin package 9, thus encapsulating the chip mounts 1, the semiconductor chips 7, the bonding wire 8, and the common leads 2. One surface of the metallic plate 10 remains exposed. In the resin-molding process, the forming resin is preferably injected from the chip mount side, thus preventing the fine common leads 2 and external leads 3 from becoming deformed due to the pressure under which the resin is injected. After the molding process has been finished, the semiconductor device is taken out from the die, the connecting strip 4 and the tie bars 5 and 5a remaining on the outer side of the resin package 9 are cut off using a lead-processing machine, and the external leads 3 are subjected to a bending process to complete the product. The bending configuration allows for efficient mating with a counterpart lead frame.

Figure 4A:
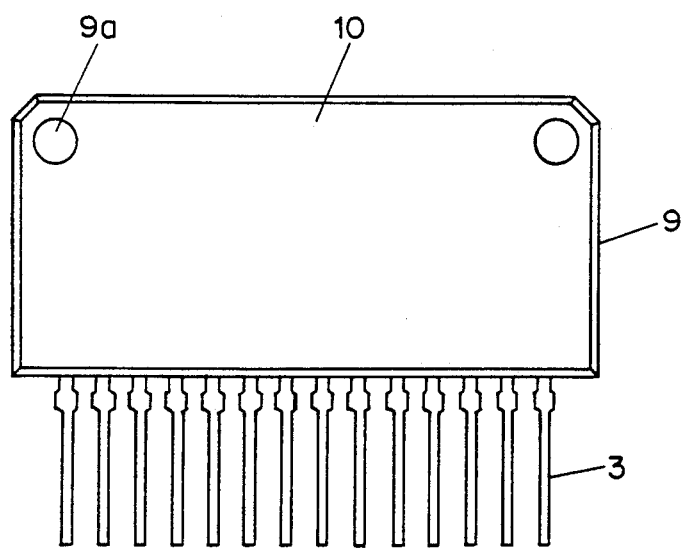
FIG. 4(a) is a bottom plan view of a completely assembled semiconductor device.
Figure 4B:
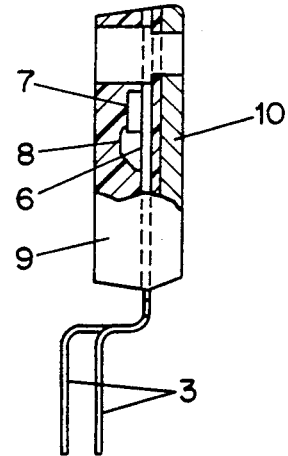
FIG. 4(b) is a side view, partially in section, of the device shown in FIG. 4(a).

FIGS. 4(a) and 4(b) are drawings of the complete product assembled as described above, where the above-mentioned thick heat-dissipating metallic plate 10 is laid closer to the closed end of the lead frame 6 and sealed in the package so that it is integrated with one side of the metallic plate 10 remaining exposed. FIG. 4(a) provides a view from the bottom of the complete product showing the metallic plate 10, the fixing screw holes 9a, the resin package 9 which is visible along the edges from this angle, and the external leads 3 after the unnecessary portions of the tie bar 5a have been cut away. FIG. 4(b) shows a side view of the complete product. Some of the resin package 9 is removed from the drawing so that the relationship between the resin package 9, the lead frame 6, a semiconductor chip 7, some bonding wire 8 and the metallic plate 10 can be seen. In this embodiment of the invention, the external leads 3 have been bent in two different manners. Other lead-bending configurations are, of course, possible.

The invention as described above offers several significant advantages over the prior art. It will be appreciated by those skilled in the art that in a typical semiconductor device in which several semiconductor chips are assembled on a single lead frame, electrodes with a common potential are found for every semiconductor chip in the circuit. Accordingly, by means of grouping the electrodes with a common potential and connecting them by group to the common leads on the lead frame via wire-bonding, the internal wiring can be simplified, the number of external leads can be reduced, and size and weight reduction of the semiconductor device can be realized.

Furthermore, according to the present invention, by appropriately cutting off the unnecessary portions of the common leads 2 according to the desired circuit configuration, the external leads 3 can be used as leads running in line with either single-pole leads or common leads on other devices, thereby enabling a lead frame with the same basic pattern to be applied to different semiconductor devices having a variety of applications.

In addition, disposing the chip mounts 1 on the side opposite the external lead draw-out side and forming them on the periphery of the pattern facilitates the dissipation of the heat generated from the semiconductor chips 7 mounted thereon. Furthermore, by using the external leads 3 laid on opposite ends of the row of external leads 3 for the main terminal through which the main current flows, and using the external leads 3 laid in the middle of the row of external leads 3 for the control terminal, a temperature rise in the external leads 3 due to the flow of the main current may be suppressed.

Additionally, a high heat dissipation effect can be assured by widening the width of the conductor pattern formed on the printed wiring board of the counterpart lead frame connected to the external leads of the present invention. Those skilled in the art will appreciate that the width of the conductor pattern on the printed wiring board side needs to be matched with that of the external leads of the semiconductor device mounted thereon. However, the conductor patterns laid on opposite ends of the lead rows may be formed with a wider width without being restricted by the external lead arrangement.

A heat-dissipating metallic plate 10 may be molded integrally to the bottom of the resin package 9 close to and facing the rear side of the lead frame 6. In such a construction, the heat-dissipating metallic plate 10 serves as a heat sink to effectively dissipate heat generated from the flow of the current in the semiconductor chips 7, thereby further improving the heat-dissipating effect.

I claim:

1. A lead frame for facilitating assembly and interconnection of a plurality of integrated circuit chips to form a module, said lead frame comprising a pattern of planar conductors comprising:

a plurality of common leads disposed in a semicircular pattern, each common lead being adapted for common connection to selected electrodes of said plurality of chips;

a plurality of chip mount conductive areas, each for mounting one of said plurality of chips, disposed along the curved periphery of said semicircular pattern of common leads;

a surrounding outer connecting strip having an open end and a closed end, said closed end connected to each of said plurality of chip mount conductive area be respective tie bars;

a chip mount lead extending from each of said chip mount conductive areas;

a first plurality of parallel external leads drawn out from said common leads; and a second plurality of parallel external leads drawn out form said chip mount leads, said first and second pluralities of external leads arranged in a row and all temporarily connected together and to said outer connecting strip by a common tie bar extending across the open end of said outer connecting strip.

2. The lead frame of claim 1 wherein a portion of said second plurality of parallel external leads are disposed at one end of said row of external leads and the remaining portion of said second plurality of parallel leads is disposed at the other end of said row of external leads with said first plurality of external leads disposed therebetween.

3. A semiconductor device comprising:

a lead frame, having top and bottom surfaces, comprising a pattern of planar conductors comprising a plurality of common leads disposed in a semicircular pattern, a plurality of chip mount conductive areas, each for mounting one of the plurality of chips, disposed along the curved periphery of said semicircular pattern of common leads, each common lead being adapted for common connection to selected electrodes of said plurality of chips, a chip mount lead extending from each of said chip mount conductive areas, a first plurality of parallel external leads drawn out form said common leads, and a second plurality of parallel external leads each extending from a respective chip mount leads, said first and second pluralities of external leads arranged in a row;

a semiconductor chip mounted on each of said chip mount conductive areas on the top surface of said lead frame;

bonding wire connecting predetermined semiconductor chip electrodes to predetermined common leads; and a resin package encapsulating said semiconductor chips, said bonding wire, said chip mount conductive areas, said chip mount leads and said common leads.

4. The semiconductor device of claim 3 further comprising a heat-dissipating metallic plate having top and bottom surfaces, the top surface of said metallic plate encapsulated within said resin package and covering, on the bottom surface of said lead frame, said chip mount conductive areas, said chip mount leads and said common leads, and the bottom surface of said metallic plate remaining exposed.

* * * * *